(12) United States Patent
Zhao et al.

(10) Patent No.: US 11,214,495 B2
(45) Date of Patent: Jan. 4, 2022

(54) PREPARATION METHOD OF PHOSPHOTUNGSTIC ACID

(71) Applicant: CENTRAL SOUTH UNIVERSITY, Hunan (CN)

(72) Inventors: Zhongwei Zhao, Hunan (CN); Yongli Li, Hunan (CN)

(73) Assignee: CENTRAL SOUTH UNIVERSITY, Hunan (CN)

( * ) Notice: Subject to any disclaimer, the term of this patent is extended or adjusted under 35 U.S.C. 154(b) by 83 days.

(21) Appl. No.: 16/327,334

(22) PCT Filed: Aug. 3, 2017

(86) PCT No.: PCT/CN2017/095790
§ 371 (c)(1),
(2) Date: Feb. 22, 2019

(87) PCT Pub. No.: WO2018/036361
PCT Pub. Date: Mar. 1, 2018

(65) Prior Publication Data
US 2019/0185341 A1    Jun. 20, 2019

(30) Foreign Application Priority Data

Aug. 26, 2016 (CN) .......................... 201610742240.8
Aug. 26, 2016 (CN) .......................... 201610742490.1
Aug. 26, 2016 (CN) .......................... 201610743022.6
Aug. 26, 2016 (CN) .......................... 201610743870.7
Aug. 26, 2016 (CN) .......................... 201610743901.9

(51) Int. Cl.
| | | |
|---|---|---|
| C01G 41/00 | (2006.01) | |
| C01B 25/16 | (2006.01) | |
| C30B 29/10 | (2006.01) | |
| C30B 7/02 | (2006.01) | |
| B01J 27/188 | (2006.01) | |

(52) U.S. Cl.
CPC .......... C01G 41/006 (2013.01); B01J 27/188 (2013.01); C01B 25/16 (2013.01); C01G 41/00 (2013.01); C01G 41/003 (2013.01); C30B 7/02 (2013.01); C30B 29/10 (2013.01)

(58) Field of Classification Search
CPC .... C01G 41/006; C01G 41/00; C01G 41/003; C01B 25/16; C30B 29/10; C30B 7/02; B01J 27/188; B01J 27/199
See application file for complete search history.

(56) References Cited

U.S. PATENT DOCUMENTS

| | | |
|---|---|---|
| 1,301,592 A | 4/1919 | Ovren |
| 2,503,991 A | 4/1950 | Bechtold |
| 3,288,562 A | 11/1966 | Laferty |
| 3,361,518 A | 1/1968 | Chiola et al. |
| 2013/0195737 A1* | 8/2013 | Zhao ................. C22B 34/36 423/54 |

FOREIGN PATENT DOCUMENTS

| | | |
|---|---|---|
| CN | 1301592 | 7/2001 |
| CN | 1544483 | 11/2004 |
| CN | 1978327 | 6/2007 |
| CN | 1990387 | 7/2007 |
| CN | 102659181 | 9/2012 |
| CN | 103073061 | 5/2013 |
| CN | 103805793 | 5/2014 |
| CN | 103805793 A * | 5/2014 |
| CN | 104711422 | 6/2015 |
| CN | 103805793 B * | 8/2015 |
| CN | 105349803 | 2/2016 |
| CN | 106082343 | 11/2016 |
| CN | 106186074 | 12/2016 |
| CN | 106186075 | 12/2016 |
| CN | 106277060 | 1/2017 |
| CN | 106335928 | 1/2017 |
| GB | 1311849 | 3/1973 |
| RU | 1559773 | 10/1994 |

OTHER PUBLICATIONS

Chen et al., "Efficient Extraction of Phosphoric Acid with a Trialkyl Amine-Based Solvent Mixture," J. Chem. Eng. Data 2016, 61, 438-443. Published Dec. 21, 2015. (Year: 2015).*
Chen et al., "Solvent Extraction of Phosphotungstic Acid", Journal of East China Institute of Chemical Technology, Dec. 1989, pp. 33-39.
"International Search Report (Form PCT/ISA/210)", dated Nov. 9, 2017, with English translation thereof, pp. 1-6.

* cited by examiner

*Primary Examiner* — Anthony J Zimmer
(74) *Attorney, Agent, or Firm* — JCIPRNET

(57) ABSTRACT

A preparation method of phosphotungstic acid includes mixing a mixed solution containing tungsten, phosphorus and an inorganic acid with an organic-alcohol-containing oil phase for extraction, stripping the obtained supported organic phase and distilled water according to an oil phase: aqueous phase volume ratio of 3:1 to 10:1 to obtain a stripping solution; and carrying out thermal evaporation crystallization or spray drying on the stripping solution to obtain a phosphotungstic acid crystal, wherein the organic alcohol is a C7-C20 alcohol. The inventors have found out that the addition of an inorganic acid to a solution of phosphorus or tungsten and the use of an organic alcohol as an extractant can achieve simultaneous and efficient extraction of phosphotungstic acid. It has also been found that the organic-alcohol-containing oil phase has excellent selectivity for phosphotungstic acid molecules in the mixed solution.

20 Claims, No Drawings

PREPARATION METHOD OF PHOSPHOTUNGSTIC ACID

CROSS-REFERENCE TO RELATED APPLICATION

This application is a 371 application of International PCT application serial no. PCT/CN2017/095790, filed on Aug. 3, 2017, which claims the priority benefit of Chinese application no. 201610742240.8, filed on Aug. 26, 2016, Chinese application no. 201610742490.1, filed on Aug. 26, 2016, Chinese application no. 201610743022.6, filed on Aug. 26, 2016, Chinese application no. 201610743870.7, filed on Aug. 26, 2016, and Chinese application no. 201610743901.9, filed on Aug. 26, 2016. The entirety of each of the abovementioned patent applications is hereby incorporated by reference herein and made a part of this specification.

BACKGROUND

Technical Field

The present invention relates to the technical field of chemical industry, and more particularly to a preparation method of phosphotungstic acid.

Description of Related Art

The heteropoly acid of the Keggin structure generally refers to inorganic compounds expressed by the following chemical formula: $H_xYZ_{12}O_{40} \cdot nH_2O$, wherein Y represents an atom such as P or Si, which is called a central atom or a heteroatom; Z represents an atom such as Mo or W and becomes a poly atom; x is 3 or 4; and n is a positive integer of 0 to 30.

Heteropoly acids are one of the most active catalysts used in acid-catalyzed reactions and redox reactions. They have good catalytic performance for hydration and esterification of olefins, etherification of epoxides, condensation alkylation of olefins and aldehydes, olefin epoxidation and alkyl aromatic hydrocarbonization. In addition, the heteropoly acid as a catalyst has the advantages of high catalytic activity, high selectivity, small corrosion effect, controllable reaction, etc. In addition, it is stable in structure and recyclable, so it has received wide attention, especially in petrochemical industry.

Phosphotungstic acid $H_3PW_{12}O_{40} \cdot nH_2O$ is most widely used in heteropoly acid, and its purity directly affects the conversion rate of its catalytic system. Therefore, it is especially important to prepare high-purity phosphotungstic acid.

H. S. Booth et al. first reported the synthesis method of phosphotungstic acid in 1939, and the disclosed synthesis method of phosphotungstic acid is still used today, that is, a diethyl ether acidification extraction method. The diethyl ether acidification extraction method can be used to purify phosphotungstic acid. That is, industrial phosphotungstic acid is prepared into a solution, mixed with diethyl ether and subjected to phase separation to obtain an diethyl ether-phosphotungstic acid complex, the phosphotungstic acid as well as impurity anions and impurity cations is subjected to phase separation, and then the diethyl ether in the adduct is evaporated to obtain a purified phosphotungstic acid crystal. However, this method has a big disadvantage that diethyl ether is very volatile and has great potential danger to the safety of the environment and workers.

UK 1311849 (1973) discloses a method for synthesizing phosphotungstic acid. According to the method, calcium phosphotungstate is firstly prepared by a complicated technique, then the calcium phosphotungstate is separated, and sulfuric acid is added to decompose it into a calcium sulfate precipitate and a phosphotungstic acid solution. The method uses a large amount of concentrated acid, and has the defects of long cycle, severe equipment corrosion, high impurity content and low yield.

Russian Patent Document RU1559773 (1994) discloses a method for synthesizing phosphotungstic acid by electrodialysis. The product obtained by the method has high purity, however it is difficult for industrialization, and the yield is lower than 30%.

U.S. Pat. Nos. 2,503,991, 3,288,562 and 3,361,518 successively disclose a method for preparing phosphotungstic acid by using an H-type cation exchange resin. The method has the defects of complicated steps, low concentration of the obtained phosphotungstic acid, and high energy consumption due to the need for evaporating a large amount of solution. Moreover, during the ion exchange, part of the tungstic acid is precipitated and adsorbed on the surface of the exchange resin, which greatly reduces the use efficiency of the ion exchange resin.

According to the method in U.S. Pat. No. 1,301,592A, tungsten hexachloride used as a raw material is firstly hydrolyzed and then reacts with phosphoric acid to produce phosphotungstic acid. The raw material of this preparation method is free of impurity cations, but the tungsten hexachloride is expensive, so this preparation method is not suitable for large-scale industrial production.

Chinese patent document ZL 99124994.1 discloses a preparation method of phosphotungstic acid: sodium tungstate is used as a raw material, hydrogen peroxide is added as a complexing agent, a reducing agent is added after the addition of an inorganic acid to obtain active tungstic acid, and finally, the active tungstic acid is dissolved in a dilute phosphoric acid solution, followed by concentration and crystallization, to obtain phosphotungstic acid. This method is complicated in process and high in cost, and the obtained phosphotungstic acid contains excess phosphate. Chinese Patent Document ZL 200310115397.0 improves the above method: an organic solvent C3-C20 ethers is used for complex extraction, and then the phosphotungstic acid-supported ether adduct is heated for concentration to obtain a phosphotungstic acid crystal. This method is similar to the traditional ether acidification extraction method, and needs to evaporate ether to concentrate to obtain the phosphotungstic acid crystal. The organic reagent ether used is volatile, hydrogen peroxide is used as a complexing agent to produce active tungstic acid in the preparation process, and it is also necessary to add a reducing compound such as sulfur dioxide after the addition of phosphorus to produce phosphotungstic acid, which results in high cost, so the method has the defects of high cost, low safety and environmental pollution.

Chinese Patent Document 200510126059.6 discloses a method for preparing high-purity phosphotungstic acid using sodium tungstate as a raw material: firstly contacting a sodium tungstate solution with an inorganic acid solution to produce an active tungstic acid precipitate, then enabling the active tungstic acid precipitate to contact with a phosphoric acid solution to obtain a phosphotungstic acid solution, and finally adding an inorganic acid to the phosphotungstic acid solution to precipitate the phosphotungstic acid, which is filtered and crystallized to obtain high-purity phosphotungstic acid. In this method, the active tungstic acid is firstly prepared, and a large amount of sodium ion impurities are removed. However, in the process of adding the inorganic acid precipitant to precipitate the phosphotungstic acid, the inorganic acid is included, and since the phosphotungstic acid has a large solubility in water, the inorganic acid included in the phosphotungstic acid crystal cannot be washed with water, the obtained phosphotungstic acid contains high anion impurities which are difficult to remove. The Chinese patent documents ZL 200510135173.5 and 201210139502.3 are similar to the above method. Firstly, the active tungstic acid is prepared, then an inorganic acid precipitant is used to precipitate the phosphotungstic acid crystal to prepare the phosphotungstic acid, which is also faced with the problem that the inorganic acid inclusion cannot be washed.

The tungsten ore is mainly composed of scheelite. The world's scheelite accounts for ⅔ of the total or more, and scheelite in China accounts for 72.1%. Chinese Patent Document 201210457552.6 provides a method for preparing ammonium paratungstate by decomposing scheelite with a sulfuric acid-phosphoric acid mixture. In this method, the scheelite is used as a raw material to firstly prepare a mixed solution of phosphotungstic acid and phosphoric acid/phosphoric acid, the mixed solution is separated by cooling crystallization to obtain a primary phosphotungstic acid crystal, the primary phosphotungstic acid crystal is dissolved in an acid solution for secondary cooling crystallization, and after ammonia dissolution and phosphorus removal, evaporation crystallization is performed to prepare the ammonium paratungstate. Firstly, this method needs to cool the high-temperature liquid to realize the extraction of phosphotungstic acid, and requires two times of cooling crystallization, which is difficult to realize in the industrialization process; and secondly, impurities such as inorganic acid, iron, manganese and calcium are adsorbed in the crystallization process of phosphotungstic acid, and insoluble matters such as calcium tungstate, manganese tungstate and iron tungstate are produced during the ammonia dissolution, thereby reducing the yield of tungsten.

Chinese Patent Document 201510114787.9 discloses a method for extracting tungsten from a sulfuric acid-phosphoric acid mixture liquid by using tributyl phosphate as a main extractant. According to this method, an alkaline stripping agent is directly mixed with a supported organic phase to obtain an ammonium tungstate solution, a blank organic phase needs to be acid-washed before it can be reused, the direct contact between the alkaline stripping agent and the tungsten-supported organic phase facilitates the emulsification of the organic phase, also makes the operation unsafe. At the same time, the tributyl phosphate is easily entrained with ammonium ions after stripping with ammonia water, which requires a multi-stage washing process. If the ammonium ions enter the sulfuric acid-phosphoric acid mixture solution, the tungsten will precipitate in the form of ammonium phosphotungstate, causing serious loss of tungsten and severe emulsification. Therefore, it is necessary to develop a new method, which has the advantages of short process, low cost, high product yield and no pollution and can realize large-scale industrial production.

Through the comparison of the above various methods, it is found that the existing methods for preparing phosphotungstic acid have various problems such as complicated technique, low yield, environmental pollution, high cost, small safety factor and the like, and large-scale industrial production is difficult to realize.

SUMMARY

Technical Problems

In order to solve the technical problems of complicated technique, high cost and low yield in the existing phosphotungstic acid preparation process, the present invention provides a preparation method of phosphotungstic acid, which aims to simplify the process, reduce the production cost and enable the production process to be green and pollution-free.

Solutions to Problems

Technical Schemes

A preparation method of phosphotungstic acid includes: mixing a mixed solution containing tungsten, phosphorus and an inorganic acid with an organic-alcohol-containing oil phase for extraction, stripping the obtained supported organic phase and distilled water according to an oil phase: aqueous phase volume ratio of 3:1 to 10:1 to obtain a stripping solution, and carrying out thermal evaporation crystallization or spray drying on the stripping solution to obtain a phosphotungstic acid crystal;

wherein Scheme A, Scheme B, Scheme C or Scheme D is included:

Scheme A: the mixed solution is obtained by reacting a tungsten source of white tungstic acid or artificial scheelite with an aqueous solution of a phosphorus compound and an inorganic acid;

Scheme B: the mixed solution is obtained by dissolving an industrial sodium tungstate crystal in water, then adding the phosphorus compound and inorganic acid and mixing;

in the extraction process in Scheme A and Scheme B, the oil phase:aqueous phase volume ratio is respectively 2:1 to 1:5;

Scheme C: the mixed solution is a phosphotungstic acid solution containing an inorganic acid, which is obtained by dissolving an industrial phosphotungstic acid crystal in water, adding an inorganic acid and mixing, wherein the concentration of tungsten trioxide is 50 to 150 g/L, and the volumetric molar concentration of the inorganic acid is 0.5 to 6 mol/L; in the extraction process, the volume concentration of the organic alcohol in the organic-alcohol-containing oil phase is 5 to 50%; the oil phase:aqueous phase volume ratio is 1:1 to 10:1;

Scheme D: the mixed solution is a tungsten-containing sulfuric acid-phosphoric acid mixture solution, wherein the concentration of tungsten trioxide is 25 to 150 g/L, the concentration of phosphoric acid is 10 to 200 g/L, and the concentration of sulfuric acid is adjusted to 1.5 to 2.5 mol/L; and the oil phase:aqueous phase volume ratio in the extraction process is 3:1 to 1:3.

The inventors have originally found out that the addition of an inorganic acid to a solution of phosphorus or tungsten and the use of an organic alcohol as an extractant can achieve simultaneous and efficient extraction of phosphotungstic acid. It has also been found that the organic-alcohol-containing oil phase has excellent selectivity for phosphotungstic acid molecules in the mixed solution, and does not extract impurity cations such as sodium ions and iron ions, and impurity anions such as sulfate ions, phosphate ions, and chloride ions. Besides, the present invention also uses distilled water for stripping; and the organic phase after stripping is not doped with impurities and can be directly recycled. In addition, the research process also found that the phase separation effect of the extraction and stripping process of the present invention is good, it is not easy to emulsify, and the separation is simple. The present invention has the advantages of simple technique, short process, low preparation cost and no environment pollution, and can easily realize large-scale industrial production.

The method of the present invention can be specifically divided into four preferred schemes of A, B, C and D. The four preferred schemes all have the innovative technical characteristics of extracting a mixed solution containing tungsten, phosphorus and an inorganic acid and an organic-alcohol-containing extraction solvent and stripping the extracted supported organic phase with distilled water, and have the common innovations.

In the present invention, the phosphorus source and the tungsten source in Scheme A and Scheme B are not from the same material. The tungsten source is white tungstic acid, artificial scheelite or an industrial sodium tungstate crystal. The phosphorus source is derived from a phosphorus compound. In Scheme C, the phosphorus and tungsten are derived from the same material, that is, phosphotungstic acid; and the phosphotungstic acid selected in Scheme C of the present invention is of industrial grade, has low purity, and can be purified by the extraction and stripping method of the present invention to realize purification of industrial-grade phosphotungstic acid. The mixed solution selected in Scheme D is a sulfuric acid-phosphoric acid mixture solution formed by a smelting process.

Preferably, in Scheme A or Scheme B, the phosphorus compound is one or more of phosphoric acid, sodium phosphate and phosphorus pentoxide.

Preferably, the inorganic acid is one or more of sulfuric acid, hydrochloric acid and nitric acid.

Preferably, in Scheme A, the mixed solution contains 10 to 150 g/L tungsten trioxide and 5 to 100 g/L phosphorus. The volumetric molar concentration of the inorganic acid is preferably 1 to 4 mol/L.

Preferably, in Scheme B, the mixed solution contains 10 to 150 g/L tungsten trioxide and 10 to 100 g/L phosphorus; and the volumetric molar concentration of the inorganic acid is 1 to 4 mol/L.

Preferably, in Scheme C, the mixed solution is obtained by dissolving an industrial phosphotungstic acid crystal in water, adding an inorganic acid and mixing, wherein the concentration of the tungsten trioxide is 50 to 150 g/L, and the volumetric molar concentration of the inorganic acid is 1 to 4 mol/L.

In the present invention, the organic-alcohol-containing oil phase (extraction solvent) contains an organic alcohol and a diluent sulfonated kerosene.

Preferably, the organic alcohol is a C7-C20 alcohol.

Further preferably, the organic alcohol is octanol to dodecanol.

Preferably, in the organic-alcohol-containing oil phase, the concentration of the organic alcohol is 10 to 50%. The balance is a diluent sulfonated kerosene.

Preferably, in Scheme C, in the organic-alcohol-containing oil phase, the concentration of the organic alcohol is 10 to 30%.

Preferably, in Scheme C, if the industrial phosphotungstic acid crystal raw material contains molybdenum, hydrogen peroxide is firstly added in an amount of 2 to 2.5 times the total molar amount of tungsten and molybdenum into the stripping solution obtained in step III, and the molybdenum is removed by extraction with tributyl phosphate.

The inventors have also found that an ammonium source can be introduced into the stripping solution obtained in Scheme D to produce ammonium paratungstate.

Preferably, the method of the present invention further includes Scheme E: ammonia water is added or ammonia gas is introduced into the stripping solution in Scheme D, and the free ammonia in the solution is controlled at 1 to 2 mol/L to obtain an ammonium tungstate solution; and phosphorus is removed from the ammonium tungstate solution by a conventional method, and evaporation crystallization is carried out to obtain ammonium paratungstate.

In the present invention, Scheme A includes the following steps:

step A1: adding white tungstic acid to the prepared aqueous solution containing the phosphorus compound and the inorganic acid to carry out a reaction to obtain a mixed solution;

step A2: mixing the mixed solution obtained in step A1 with an alcohol-containing oil phase (that is, an organic-alcohol-containing oil phase) for extraction, the oil phase: aqueous phase volume ratio being 2:1 to 1:5, to obtain a supported organic phase;

step A3: stripping the supported organic phase obtained in step A2 with distilled water in an oil phase:aqueous phase volume ratio of 3:1 to 10:1 to obtain a stripping solution; and step A4: carrying out thermal evaporation crystallization or spray drying on the stripping solution obtained in step A3 to obtain a phosphotungstic acid crystal.

Preferably, in step A1, the white tungstic acid is replaced with artificial scheelite, of which the composition is $CaWO_4$.

Preferably, in step A1, the phosphorus compound is one or more of phosphoric acid, sodium phosphate, phosphorus pentoxide, more preferably phosphoric acid.

Preferably, in step A1, the volumetric molar concentration of the inorganic acid is 1 to 4 mol/L, more preferably 2 to 3 mol/L.

Preferably, in step A1, the inorganic acid is one or more of sulfuric acid, hydrochloric acid and nitric acid, more preferably sulfuric acid.

Preferably, in step A1, the mixed solution contains 10 to 150 g/L tungsten trioxide, more preferably 80 to 120 s g/L, and 5 to 100 g/L phosphorus, more preferably 10 to 20 g/L.

Preferably, in step A2, the concentration of the organic alcohol is 10 to 50%, more preferably 10 to 30%.

Preferably, in step A2, the organic alcohol is a C7-C20 alcohol.

Preferably, in step A2, a diluent sulfonated kerosene is added.

The present invention further includes phosphotungstic acid obtained by using Scheme A.

Scheme B specifically includes the following steps:

step B1: dissolving an industrial sodium tungstate crystal in water, and then adding a phosphorus compound and an inorganic acid to obtain a mixed aqueous solution (the mixed solution);

step B2: mixing the mixed aqueous solution obtained in step B1 with an organic alcohol (the organic alcohol is derived from the extraction solvent, that is, the organic-alcohol-containing oil phase) for extraction, the oil phase: aqueous phase volume ratio being 2:1 to 1:5, to obtain a supported organic phase;

step B3: stripping the supported organic phase obtained in step B2 with distilled water in an oil phase:aqueous phase volume ratio of 3:1 to 10:1 to obtain a stripping solution; and step B4: carrying out thermal evaporation crystallization or spray drying on the stripping solution obtained in step B3 to obtain a phosphotungstic acid crystal.

Preferably, in step B1, the phosphorus compound is one or more of phosphoric acid, sodium phosphate and phosphorus pentoxide.

Preferably, in step B1, the inorganic acid is one or more of sulfuric acid, hydrochloric acid and nitric acid.

Preferably, in step B1, the mixed aqueous solution contains 10 to 150 g/L tungsten trioxide and 10 to 100 g/L phosphorus; and the molar concentration of the inorganic acid in the mixed aqueous solution is 1 to 4 mol/L.

Preferably, in step B2, in the organic-alcohol-containing oil phase, the concentration of the organic alcohol is 10 to 50%.

Preferably, in step B2, the organic alcohol is a C7-C20 alcohol.

Preferably, in step B2, a diluent sulfonated kerosene is added.

The present invention further includes phosphotungstic acid obtained by using Scheme B.

Scheme C can be considered as a purification scheme for industrial phosphotungstic acid, and can mainly realize the technical effects of reducing the production cost in the purification of the phosphotungstic acid crystal, simplifying the technical steps and achieving the goal of greenness and no pollution.

Scheme C specifically includes the following steps:

step C1: dissolving an industrial phosphotungstic acid crystal in water and adding an inorganic acid to obtain an inorganic-acid-containing phosphotungstic acid solution, wherein the concentration of tungsten trioxide is 50 to 150 g/L, and the volumetric molar concentration of the inorganic acid is 0.5 to 6 mol/L;

step C2: adding an oil phase organic alcohol extractant (that is, the organic-alcohol-containing oil phase) of which the volume concentration is 5 to 50% to the inorganic-acid-containing phosphotungstic acid solution obtained in step C1 for extraction, the oil phase:aqueous phase volume ratio being 1:1 to 10:1, to obtain a tungsten-containing supported organic phase;

step C3: stripping the tungsten-containing supported organic phase obtained in step C2 with distilled water in an oil phase:aqueous phase volume ratio of 3:1 to 10:1 to obtain a stripping solution; and step C4: carrying out thermal evaporation crystallization or spray drying on the stripping solution obtained in step C3 to obtain a high-purity phosphotungstic acid crystal.

Preferably, in step C1, the volumetric molar concentration of the inorganic acid is 1 to 4 mol/L.

Preferably, in step C1, the inorganic acid is one or more of sulfuric acid, hydrochloric acid and nitric acid.

Preferably, in step C2, the concentration of the organic alcohol is 10 to 30%.

Preferably, in step C2, the organic alcohol is a C7-C20 alcohol.

Preferably, in step C2, a diluent sulfonated kerosene for an extractant is added.

Preferably, if the industrial phosphotungstic acid crystal raw material contains molybdenum, hydrogen peroxide is firstly added in an amount of 2 to 2.5 times the total molar amount of tungsten and molybdenum into the stripping solution obtained in step C3, and the molybdenum is removed by extraction with tributyl phosphate.

The present invention further provides a high-purity phosphotungstic acid crystal obtained by the purification method of a phosphotungstic acid crystal.

Scheme C of the present invention has the advantages of simple technique, short process, low preparation cost and no environment pollution, and can easily realize large-scale industrial production.

Scheme D specifically includes the following steps:

step D1: taking a tungsten-containing sulfuric acid-phosphoric acid mixture solution (the mixed solution), wherein the concentration of tungsten trioxide is 25 to 150 g/L, the concentration of the phosphoric acid is 10 to 200 g/L, and the concentration of the sulfuric acid is adjusted to 1.5 to 2.5 mol/L;

step D2: mixing the tungsten-containing sulfuric acid-phosphoric acid mixture solution obtained in step D1 with an oil phase (that is, an organic-alcohol-containing oil phase) for extraction, the oil phase:aqueous phase volume ratio being 3:1 to 1:3, to obtain a supported organic phase;

step D3: stripping the supported organic phase obtained in step D2 with distilled water in an oil phase:aqueous phase volume ratio of 3:1 to 10:1 to obtain a stripping solution; and step D4: carrying out thermal evaporation crystallization on the stripping solution obtained in step D3 to obtain a phosphotungstic acid crystal.

Preferably, in step D2, the oil phase includes an extractant and a diluent, the extractant accounts for 5 to 50% by volume of the oil phase, and the balance is the diluent.

Preferably, the extractant is a C7-C20 organic alcohol.

Preferably, the extractant is octanol to dodecanol.

Preferably, the diluent is sulfonated kerosene.

Preferably, in step D4, the stripping solution is subjected to spray drying instead of thermal evaporation crystallization.

The present invention further provides a phosphotungstic acid crystal obtained by the method for preparing a phosphotungstic acid crystal from a tungsten-containing sulfuric acid-phosporic acid mixture solution.

The method of Scheme D has the advantages of simple technique, short process, low preparation cost and no environment pollution, and can easily realize large-scale industrial production.

The technical problems to be solved by Scheme E is how to shorten the process, reduce the cost and increase the yield of the product in the preparation of ammonium paratungstate (APT) and realize large-scale industrial production, so as to provide a method for preparing ammonium paratungstate from a tungsten-containing sulfuric acid-phosphoric acid mixture solution.

In order to solve the above technical problems, the present invention provides a method for preparing ammonium paratungstate (APT) from a tungsten-containing sulfuric acid-phosphoric acid mixture solution (the raw materials used are all commercially available).

Scheme E specifically includes the following steps:

step E1: taking a tungsten-containing sulfuric acid-phosphoric acid mixture solution (the mixed solution), wherein the concentration of tungsten trioxide is 25 to 150 g/L, the concentration of the phosphoric acid is 10 to 200 g/L, and the concentration of the sulfuric acid is adjusted to 1.5 to 2.5 mol/L;

step E2: mixing the tungsten-containing sulfuric acid-phosphoric acid mixture solution obtained in step E1 with an oil phase (that is, an organic-alcohol-containing oil phase) for extraction, the oil phase:aqueous phase volume ratio being 3:1 to 1:3, to obtain a supported organic phase;

step E3: stripping the supported organic phase obtained in step E2 with distilled water in an oil phase:aqueous phase volume ratio of 3:1 to 10:1 to obtain a stripping solution;

step E4: adding ammonia water to the stripping solution obtained in step E3, and controlling the free ammonia in the solution at 1 to 2 mol/L to obtain an ammonium tungstate solution; and step E5: removing phosphorus from the ammonium tungstate solution obtained in step E4 by a conventional method, and carrying out evaporation crystallization to obtain ammonium paratungstate.

Preferably, in step E2, the oil phase includes an extractant and a diluent, the extractant accounts for 5 to 50% by volume of the oil phase, and the balance is the diluent.

Preferably, the extractant is a C7-C20 organic alcohol.

Preferably, the extractant is octanol to dodecanol.

Preferably, the diluent is sulfonated kerosene.

Preferably, in step E4, the addition of ammonia water is replaced with the introduction of ammonia gas, and the flow rate of the ammonia gas is such that the ammonia gas does not directly overflow, and the concentration of the free ammonia in the final solution is controlled to 1 to 2 mol/L.

In Scheme E, by increasing the acidity of the solution and using the alcohol of a lower concentration as an extractant, since the alcohol extractant is a weak neutral extractant and does not extract iron, calcium, manganese, sulfate, phosphate and the like, the present invention can treat a solution having a high impurity content. The high-concentration phosphotungstic acid solution is obtained by using water as a stripping agent, and then ammonia water is added, thereby avoiding the problem that the direct contact between the alkaline stripping agent and the supported organic phase easily causes the emulsification of the organic phase in the traditional technique; and the blank organic phase after stripping with water can be used for extraction in the previous step without the recycling process of the organic phase, and the organic phase after stripping with water does not have the problem of introducing impurities into the raw solution. The method of the present invention has the advantages of short technical process, low manufacturing cost, high product yield and no pollution, and can realize large-scale industrial production.

The present invention further provides ammonium paratungstate obtained by the method for preparing ammonium paratungstate from a tungsten-containing sulfuric acid-phosphoric acid mixture solution.

Beneficial Effects of the Invention

Beneficial Effects

In the present invention, by using an alcohol extractant, the efficient extraction of phosphotungstic acid can be achieved by adjusting the concentration of the inorganic acid in the phosphotungstic acid solution. The extractant used is an alcohol extractant, which only extracts the phosphotungstic acid molecules and does not extract impurity cations such as sodium ions and iron ions and impurity anions such as sulfate ions, phosphate ions, and chlorine ions, and the phase separation effect is good, so no entrainment of the aqueous solution is caused. It is especially important that the obtained supported organic phase can be directly stripped with distilled water, and the organic phase after stripping can be directly recycled without further treatment. The present invention has the advantages of simple technique, short process, low preparation cost and no environment pollution, and can easily realize large-scale industrial production.

DESCRIPTION OF THE EMBODIMENTS

Embodiments of the Invention

Implementations of the Invention

Implementations of the present invention will be further described in detail below with reference to the embodiments. The following embodiments are intended to illustrate the present invention, but are not intended to limit the scope of the present invention.

Embodiments (1 to 5) of Scheme A

Embodiment 1

White tungstic acid was placed in water, and then phosphoric acid and hydrochloric acid were added to produce a phosphotungstic-acid-containing mixed solution, containing 120 g/L tungsten trioxide, 5 g/L phosphorus and 3 mol/L hydrochloric acid. By using 15% n-octanol as an extractant and sulfonated kerosene as a diluent, four-stage countercurrent extraction was performed, the O/A (oil phase/aqueous phase) ratio being 1:1; and the supported organic phase was subjected to five-stage countercurrent stripping by using water as a stripping agent, the O/A (oil phase/aqueous phase) ratio being 5:1. The stripping solution, in which the concentration of tungsten trioxide was 549.6 g/L, was subjected to evaporation crystallization to obtain a white phosphotungstic acid crystal. Based on the concentration of the tungsten trioxide obtained from the stripping solution, the yield was up to 91.6%.

Embodiment 2

White tungstic acid was placed in water, and then sodium phosphate and sulfuric acid were added to produce a phosphotungstic-acid-containing mixed solution, containing 10 g/L tungsten trioxide, 5 g/L phosphorus and 4 mol/L sulfuric acid. By using 15% nonanol as an extractant and sulfonated kerosene as a diluent, four-stage countercurrent extraction was performed, the O/A ratio being 1:5; and the supported organic phase was subjected to five-stage countercurrent stripping by using water as a stripping agent, the O/A ratio being 10:1. The stripping solution, in which the concentration of tungsten trioxide was 423.5 g/L, was subjected to spray drying to obtain a white phosphotungstic acid crystal. Based on the concentration of the tungsten trioxide obtained from the stripping solution, the yield was up to 84.7%.

Embodiment 3

Artificial scheelite (calcium tungstate) was placed in water, and then calcium phosphate and nitric acid were added to react to obtain a phosphotungstic-acid-containing mixed solution, containing 100 g/L tungsten trioxide, 40 g/L phosphorus and 2.5 mol/L nitric acid. By using 50% decanol as an extractant and sulfonated kerosene as a diluent, five-stage countercurrent extraction was performed, the O/A ratio being 1:1; and the supported organic phase was subjected to five-stage countercurrent stripping by using water as a stripping agent, the 0/A ratio being 1:1. The stripping solution, in which the concentration of tungsten trioxide was 96.3 g/L, was subjected to evaporation crystallization to obtain a high-purity white phosphotungstic acid crystal.

Based on the concentration of the tungsten trioxide obtained from the stripping solution, the yield was up to 96.3%.

Embodiment 4

White tungstic acid was placed in water, and then phosphorus pentoxide and sulfuric acid were added to produce a phosphotungstic-acid-containing mixed solution, containing 40 g/L tungsten trioxide, 100 g/L phosphorus and 1 mol/L sulfuric acid. By using 30% undecanol as an extractant and sulfonated kerosene as a diluent, six-stage countercurrent extraction was performed, the O/A ratio being 1:3; and the supported organic phase was subjected to three-stage countercurrent stripping by using water as a stripping agent, the O/A ratio being 3:1. The stripping solution, in which the concentration of tungsten trioxide was 285.6 g/L, was subjected to evaporation crystallization to obtain a white phosphotungstic acid crystal. Based on the concentration of the tungsten trioxide obtained from the stripping solution, the yield was up to 79.3%.

Embodiment 5

Artificial scheelite (calcium tungstate) was placed in water, and then phosphoric acid and hydrochloric acid were added to produce a phosphotungstic-acid-containing mixed solution, containing 150 g/L tungsten trioxide, 10 g/L phosphorus and 3 mol/L hydrochloric acid. By using 10% dodecanol as an extractant and sulfonated kerosene as a diluent, six-stage countercurrent extraction was performed, the O/A ratio being 2:1; and the supported organic phase was subjected to three-stage countercurrent stripping by using water as a stripping agent, the O/A ratio being 4:1. The stripping solution, in which the concentration of tungsten trioxide was 274.7 g/L, was subjected to spray drying to obtain a white phosphotungstic acid crystal. Based on the concentration of the tungsten trioxide obtained from the stripping solution, the yield was up to 91.6%.

The above implementations are merely illustrative of the present invention and are not intended to limit the present invention. Although the present invention has been described in detail with reference to the embodiments, it should be understood by those of ordinary skill in the art that various combinations, modifications and equivalents of the technical solutions of the present invention do not depart from the spirit and scope of the technical solutions of the present invention and should all be covered by the scope of the claims of the present invention.

Embodiments (6 to 10) of Scheme B

Embodiment 6

Sodium tungstate was dissolved in water, and then phosphoric acid and hydrochloric acid were added to produce a phosphotungstic-acid-containing mixed aqueous solution, containing 100 g/L tungsten trioxide, 20 g/L phosphorus and 2.5 mol/L hydrochloric acid. By using 15% sec-octanol as an extractant and sulfonated kerosene as a diluent, four-stage countercurrent extraction was performed, the O/A (oil phase/aqueous phase) volume ratio being 1:1, to obtain a supported organic phase; and the supported organic phase was subjected to five-stage countercurrent stripping by using distilled water as a stripping agent, the O/A (oil phase/aqueous phase) volume ratio being 5:1. The stripping solution, in which the concentration of tungsten trioxide was 479.4 g/L, was subjected to evaporation crystallization to obtain a white phosphotungstic acid crystal. Based on the concentration of the tungsten trioxide obtained from the stripping solution, the yield was up to 95.9%.

Embodiment 7

Sodium tungstate was dissolved in water, and then sodium phosphate and sulfuric acid were added to produce a phosphotungstic-acid-containing mixed aqueous solution, containing 10 g/L tungsten trioxide, 10 g/L phosphorus and 4 mol/L sulfuric acid. By using 10% nonanol as an extractant and sulfonated kerosene as a diluent, four-stage countercurrent extraction was performed, the O/A volume ratio being 1:5, to obtain a supported organic phase; and the supported organic phase was subjected to five-stage countercurrent stripping by using distilled water as a stripping agent, the O/A volume ratio being 10:1. The stripping solution, in which the concentration of tungsten trioxide was 384.4 g/L, was subjected to spray drying to obtain a white phosphotungstic acid crystal. Based on the concentration of the tungsten trioxide obtained from the stripping solution, the yield was up to 76.9%.

Embodiment 8

Sodium tungstate was dissolved in water, and then calcium phosphate and nitric acid were added to produce a phosphotungstic-acid-containing mixed aqueous solution, containing 80 g/L tungsten trioxide, 50 g/L phosphorus and 3 mol/L nitric acid. By using 50% decanol as an extractant and sulfonated kerosene as a diluent, five-stage countercurrent extraction was performed, the O/A volume ratio being 1:1, to obtain a supported organic phase; and the supported organic phase was subjected to five-stage countercurrent stripping by using distilled water as a stripping agent, the O/A volume ratio being 1:1. The stripping solution, in which the concentration of tungsten trioxide was 76.3 g/L, was subjected to evaporation crystallization to obtain a high-purity white phosphotungstic acid crystal. Based on the concentration of the tungsten trioxide obtained from the stripping solution, the yield was up to 95.4%.

Embodiment 9

Sodium tungstate was dissolved in water, and then phosphorus pentoxide and sulfuric acid were added to produce a phosphotungstic-acid-containing mixed aqueous solution, containing 50 g/L tungsten trioxide, 100 g/L phosphorus and 2 mol/L sulfuric acid. By using 30% undecanol as an extractant and sulfonated kerosene as a diluent, six-stage countercurrent extraction was performed, the O/A volume ratio being 1:3, to obtain a supported organic phase; and the supported organic phase was subjected to three-stage countercurrent stripping by using distilled water as a stripping agent, the O/A volume ratio being 3:1. The stripping solution, in which the concentration of tungsten trioxide was 383.4 g/L, was subjected to evaporation crystallization to obtain a white phosphotungstic acid crystal. Based on the concentration of the tungsten trioxide obtained from the stripping solution, the yield was up to 85.2%.

Embodiment 10

Sodium tungstate was dissolved in water, and then phosphoric acid and sulfuric acid were added to produce a phosphotungstic-acid-containing mixed aqueous solution, containing 150 g/L tungsten trioxide, 40 g/L phosphorus and 1 mol/L sulfuric acid. By using 30% dodecanol as an extractant and sulfonated kerosene as a diluent, six-stage countercurrent extraction was performed, the O/A volume ratio being 2:1, to obtain a supported organic phase; and the supported organic phase was subjected to three-stage countercurrent stripping by using distilled water as a stripping agent, the O/A volume ratio being 4:1. The stripping solution, in which the concentration of tungsten trioxide was 264.7 g/L, was subjected to spray drying to obtain a white phosphotungstic acid crystal. Based on the concentration of the tungsten trioxide obtained from the stripping solution, the yield was up to 88.2%.

Embodiments (11 to 15) of Scheme C

Embodiment 11

568 g of industrial phosphotungstic acid (free of molybdenum impurities) was dissolved in water, and then hydrochloric acid was added such that the solution contained 80 g/L tungsten trioxide and 3 mol/L hydrochloric acid. By using 15% sec-octanol as an extractant and sulfonated kerosene as a diluent, four-stage countercurrent extraction was performed; and the supported organic phase was subjected to five-stage countercurrent stripping by using distilled water as a stripping agent. The stripping solution was subjected to evaporation crystallization to obtain 542 g of high-purity white phosphotungstic acid. The yield was 95.4%.

Embodiment 12

660 g of industrial phosphotungstic acid (free of molybdenum impurities) was dissolved in water, and then sulfuric acid was added such that the solution contained 50 g/L tungsten trioxide and 4 mol/L sulfuric acid. By using 5% nonanol as an extractant and sulfonated kerosene as a diluent, five-stage countercurrent extraction was performed; and the supported organic phase was subjected to four-stage countercurrent stripping by using distilled water as a stripping agent. The stripping solution was subjected to evaporation crystallization to obtain 647 g of high-purity white phosphotungstic acid. The yield was 98%.

Embodiment 13

360 g of industrial phosphotungstic acid (free of molybdenum impurities) was dissolved in water, and then nitric acid was added such that the solution contained 120 g/L tungsten trioxide and 2 mol/L nitric acid. By using 50% decanol as an extractant and sulfonated kerosene as a diluent, two-stage countercurrent extraction was performed; and the supported organic phase was subjected to six-stage countercurrent stripping by using distilled water as a stripping agent. The stripping solution was subjected to evaporation crystallization to obtain 345 g of high-purity white phosphotungstic acid. The yield was 95.8%.

Embodiment 14

860 g of industrial phosphotungstic acid (containing molybdenum impurities) was dissolved in water, and then nitric acid was added such that the solution contained 150 g/L tungsten trioxide and 1 mol/L nitric acid. By using 30% undecanol as an extractant and sulfonated kerosene as a diluent, three-stage countercurrent extraction was performed; and the supported organic phase was subjected to six-stage countercurrent stripping by using distilled water as a stripping agent. 30% hydrogen peroxide was added in an amount of 2.5 times the molar amount of tungsten and molybdenum into the stripping solution, three-stage countercurrent extraction was performed with tributyl phosphate to extract molybdenum, and the obtained molybdenum extraction raffinate was subjected to evaporation crystallization to obtain 845 g of high-purity white phosphotungstic acid. The yield was 98.2%.

Embodiment 15

760 g of industrial phosphotungstic acid (containing molybdenum impurities) was dissolved in water, and then sulfuric acid was added such that the solution contained 70 g/L tungsten trioxide and 3 mol/L sulfuric acid. By using 10% laurinol as an extractant and sulfonated kerosene as a diluent, three-stage countercurrent extraction was performed; and the supported organic phase was subjected to six-stage countercurrent stripping by using distilled water as a stripping agent. 30% hydrogen peroxide was added in an amount of 2 times the molar amount of tungsten and molybdenum into the stripping solution, three-stage countercurrent extraction was performed with tributyl phosphate to extract molybdenum, and the obtained molybdenum extraction raffinate was subjected to evaporation crystallization to obtain 734 g of high-purity white phosphotungstic acid. The yield was 96.6%.

Embodiments (16 to 20) of Scheme D

Embodiment 16

5 L of industrial solution containing tungsten, sulfuric acid and phosphoric acid, which contains 100 g/L tungsten trioxide, 200 g/L phosphoric acid, 0.5 mol/L sulfuric acid, 5.4 g/L iron ions, 2 g/L manganese ions, 0.8 g/L calcium ions, 2 g/L sodium ions and other impurity ions, was taken. The concentration of the sulfuric acid was firstly adjusted to 2.5 mol/L; by using 15% sec-octanol as an extractant and sulfonated kerosene as a diluent, four-stage countercurrent extraction was performed, the O/A (oil phase/aqueous phase) ratio being 1:1; and the supported organic phase was subjected to five-stage countercurrent stripping by using water as a stripping agent, the O/A (oil phase/aqueous phase) ratio being 5:1. The stripping solution, in which the concentration of tungsten trioxide was 479.4 g/L, was subjected to evaporation crystallization to obtain high-purity white phosphotungstic acid. Based on the concentration of the tungsten trioxide obtained from the stripping solution, the yield was up to 95.9%.

Embodiment 17

2 L of industrial solution containing tungsten, sulfuric acid and phosphoric acid, which contains 30 g/L tungsten trioxide, 100 g/L phosphoric acid, 1 mol/L sulfuric acid, 5.4 g/L iron ions, 4 g/L manganese ions, 0.6 g/L calcium ions, 5 g/L sodium ions and other impurity ions, was taken. The concentration of the sulfuric acid was firstly adjusted to 1.5 mol/L; by using 15% nonanol as an extractant and sulfonated kerosene as a diluent, four-stage countercurrent extraction was performed, the O/A ratio being 1:3; and the supported organic phase was subjected to five-stage countercurrent stripping by using water as a stripping agent, the O/A ratio being 3:1. The stripping solution, in which the concentration of tungsten trioxide was 240.2 g/L, was subjected to evaporation crystallization to obtain high-purity white phosphotungstic acid. Based on the concentration of the tungsten trioxide obtained from the stripping solution, the yield was up to 89%.

Embodiment 18

8 L of industrial solution containing tungsten, sulfuric acid and phosphoric acid, which contains 150 g/L tungsten trioxide, 60 g/L phosphoric acid, 1 mol/L sulfuric acid, 2.4 g/L iron ions, 3 g/L manganese ions, 0.7 g/L calcium ions, 15 g/L sodium ions and other impurity ions, was taken. The concentration of the sulfuric acid was firstly adjusted to 2 mol/L; by using 50% decanol as an extractant and sulfonated kerosene as a diluent, five-stage countercurrent extraction was performed, the O/A ratio being 3:1; and the supported organic phase was subjected to five-stage countercurrent stripping by using water as a stripping agent, the O/A ratio being 6:1. The stripping solution, in which the concentration of tungsten trioxide was 285.2 g/L, was subjected to evaporation crystallization to obtain high-purity white phosphotungstic acid. Based on the concentration of the tungsten trioxide obtained from the stripping solution, the yield was up to 95.1%.

Embodiment 19

5 L of industrial solution containing tungsten, sulfuric acid and phosphoric acid, which contains 85 g/L tungsten trioxide, 180 g/L phosphoric acid, 0.8 mol/L sulfuric acid, 9.4 g/L iron ions, 13 g/L manganese ions, 0.7 g/L calcium ions, 5 g/L sodium ions and other impurity ions, was taken. The concentration of the sulfuric acid was firstly adjusted to 2.5 mol/L; by using 30% undecanol as an extractant and sulfonated kerosene as a diluent, five-stage countercurrent extraction was performed, the O/A ratio being 1:1; and the supported organic phase was subjected to five-stage countercurrent stripping by using water as a stripping agent, the O/A ratio being 3:1. The stripping solution, in which the concentration of tungsten trioxide was 244.2 g/L, was subjected to evaporation crystallization to obtain high-purity white phosphotungstic acid. Based on the concentration of the tungsten trioxide obtained from the stripping solution, the yield was up to 95.7%.

Embodiment 20

10 L of industrial solution containing tungsten, sulfuric acid and phosphoric acid, which contains 25 g/L tungsten trioxide, 10 g/L phosphoric acid, 0.6 mol/L sulfuric acid, 19.4 g/L iron ions, 23 g/L manganese ions, 0.7 g/L calcium ions, 1 g/L sodium ions and other impurity ions, was taken. The concentration of the sulfuric acid was firstly adjusted to 2.5 mol/L; by using 15% dodecanol as an extractant and sulfonated kerosene as a diluent, three-stage countercurrent extraction was performed, the O/A ratio being 1:1; and the supported organic phase was subjected to five-stage countercurrent stripping by using water as a stripping agent, the O/A ratio being 10:1. The stripping solution, in which the concentration of tungsten trioxide was 214.2 g/L, was subjected to evaporation crystallization to obtain high-purity white phosphotungstic acid. Based on the concentration of the tungsten trioxide obtained from the stripping solution, the yield was up to 85.7%.

Embodiments (21 to 25) of Scheme E

Embodiment 21

5 L of industrial solution containing tungsten, sulfuric acid and phosphoric acid, which contains 100 g/L tungsten trioxide, 200 g/L phosphoric acid, 0.5 mol/L sulfuric acid, 5.4 g/L iron ions, 2 g/L manganese ions, 0.8 g/L calcium ions, 2 g/L sodium ions and other impurity ions, was taken. The concentration of the sulfuric acid was firstly adjusted to 2.5 mol/L; by using 15% sec-octanol as an extractant and sulfonated kerosene as a diluent, four-stage countercurrent extraction was performed, the O/A (oil phase/aqueous phase) ratio being 1:1; and the supported organic phase was subjected to five-stage countercurrent stripping by using water as a stripping agent, the O/A (oil phase/aqueous phase) ratio being 5:1. Ammonia gas was introduced into the stripping solution in which the concentration of tungsten trioxide was 479.4 g/L to control the final free ammonia concentration to 1 mol/L, and the solution was subjected to conventional phosphorus removal and evaporation crystallization to obtain ammonium paratungstate.

Embodiment 22

2 L of industrial solution containing tungsten, sulfuric acid and phosphoric acid, which contains 30 g/L tungsten trioxide, 100 g/L phosphoric acid, 1 mol/L sulfuric acid, 5.4 g/L iron ions, 4 g/L manganese ions, 0.6 g/L calcium ions, 5 g/L sodium ions and other impurity ions, was taken. The concentration of the sulfuric acid was firstly adjusted to 1.5 mol/L; by using 15% nonanol as an extractant and sulfonated kerosene as a diluent, four-stage countercurrent extraction was performed, the O/A ratio being 1:3; and the supported organic phase was subjected to five-stage countercurrent stripping by using water as a stripping agent, the 0/A ratio being 3:1. Ammonia water was added into the stripping solution in which the concentration of tungsten trioxide was 240.2 g/L to control the final free ammonia concentration to 1.5 mol/L, and the solution was subjected to conventional phosphorus removal and evaporation crystallization to obtain ammonium paratungstate.

Embodiment 23

8 L of industrial solution containing tungsten, sulfuric acid and phosphoric acid, which contains 150 g/L tungsten trioxide, 60 g/L phosphoric acid, 1 mol/L sulfuric acid, 2.4 g/L iron ions, 3 g/L manganese ions, 0.7 g/L calcium ions, 15 g/L sodium ions and other impurity ions, was taken. The concentration of the sulfuric acid was firstly adjusted to 2 mol/L; by using 50% decanol as an extractant and sulfonated kerosene as a diluent, five-stage countercurrent extraction was performed, the O/A ratio being 3:1; and the supported organic phase was subjected to five-stage countercurrent stripping by using water as a stripping agent, the O/A ratio being 6:1. Ammonia water was added into the stripping solution in which the concentration of tungsten trioxide was 285.2 g/L to control the final free ammonia concentration to 2 mol/L, and the solution was subjected to conventional phosphorus removal and evaporation crystallization to obtain ammonium paratungstate.

Embodiment 24

5 L of industrial solution containing tungsten, sulfuric acid and phosphoric acid, which contains 85 g/L tungsten trioxide, 180 g/L phosphoric acid, 0.8 mol/L sulfuric acid, 9.4 g/L iron ions, 13 g/L manganese ions, 0.7 g/L calcium ions, 5 g/L sodium ions and other impurity ions, was taken. The concentration of the sulfuric acid was firstly adjusted to 2.5 mol/L; by using 30% undecanol as an extractant and sulfonated kerosene as a diluent, five-stage countercurrent extraction was performed, the O/A ratio being 1:1; and the supported organic phase was subjected to five-stage countercurrent stripping by using water as a stripping agent, the O/A ratio being 3:1. Ammonia gas was introduced into the stripping solution in which the concentration of tungsten trioxide was 244.2 g/L to control the final free ammonia concentration to 1 mol/L, and the solution was subjected to conventional phosphorus removal and evaporation crystallization to obtain ammonium paratungstate.

Embodiment 25

10 L of industrial solution containing tungsten, sulfuric acid and phosphoric acid, which contains 25 g/L tungsten trioxide, 10 g/L phosphoric acid, 0.6 mol/L sulfuric acid, 19.4 g/L iron ions, 23 g/L manganese ions, 0.9 g/L calcium ions, 1 g/L sodium ions and other impurity ions, was taken. The concentration of the sulfuric acid was firstly adjusted to 2.5 mol/L; by using 5% dodecanol as an extractant and sulfonated kerosene as a diluent, three-stage countercurrent extraction was performed, the O/A ratio being 1:1; and the supported organic phase was subjected to five-stage countercurrent stripping by using water as a stripping agent, the O/A ratio being 10:1. Ammonia water was added into the stripping solution in which the concentration of tungsten trioxide was 214.2 g/L to control the final free ammonia concentration to 1.6 mol/L, and the solution was subjected to conventional phosphorus removal and evaporation crystallization to obtain ammonium paratungstate.

The above implementations are merely illustrative of the present invention and are not intended to limit the present invention. Although the present invention has been described in detail with reference to the embodiments, it should be understood by those of ordinary skill in the art that various combinations, modifications and equivalents of the technical solutions of the present invention do not depart from the spirit and scope of the technical solutions of the present invention and should all be covered by the scope of the claims of the present invention.

What is claimed is:

1. A preparation method of phosphotungstic acid, comprising:
    mixing a mixed solution containing tungsten, phosphorus and an inorganic acid with an organic-alcohol-containing oil phase for extraction, the organic-alcohol-containing oil phase includes an extractant, wherein the extractant is consisting of an organic alcohol, combining an obtained supported organic phase with a stripping agent according to an oil phase:aqueous phase volume ratio of 3:1 to 10:1 to obtain a stripping solution, wherein the stripping agent is consisting of distilled water, and carrying out thermal evaporation crystallization or spray drying on the stripping solution to obtain a phosphotungstic acid crystal;
    comprising Scheme A, Scheme B, Scheme C or Scheme D:
    Scheme A: the mixed solution is obtained by reacting a tungsten source of white tungstic acid or artificial scheelite with an aqueous solution of a phosphorus compound and the inorganic acid;
    Scheme B: the mixed solution is obtained by dissolving an industrial sodium tungstate crystal in water, then adding the phosphorus compound and the inorganic acid and mixing;
    in the extraction process in Scheme A and Scheme B, the oil phase:aqueous phase volume ratio is 2:1 to 1:5;
    Scheme C: the mixed solution is a phosphotungstic acid solution containing the inorganic acid, which is obtained by dissolving an industrial phosphotungstic acid crystal in water, adding the inorganic acid and mixing, wherein the concentration of tungsten trioxide is 50 to 150 g/L, and the volumetric molar concentration of the inorganic acid is 0.5 to 6 mol/L; in the extraction process, the volume concentration of the organic alcohol in the organic-alcohol-containing oil phase is 5 to 50%; the oil phase:aqueous phase volume ratio is 1:1 to 10:1; and
    Scheme D: the mixed solution is a tungsten-containing sulfuric acid-phosphoric acid mixture solution; wherein the concentration of tungsten trioxide is 25 to 150 g/L, the concentration of phosphoric acid is 10 to 200 g/L, and the concentration of sulfuric acid is adjusted to 1.5 to 2.5 mol/L; and the oil phase:aqueous phase volume ratio in the extraction process is 3:1 to 1:3.

2. The preparation method of phosphotungstic acid according to claim 1, wherein in Scheme A or Scheme B, the phosphorus compound is one or more of phosphoric acid, sodium phosphate and phosphorus pentoxide.

3. The preparation method of phosphotungstic acid according to claim 1, wherein the inorganic acid is one or more of sulfuric acid, hydrochloric acid and nitric acid.

4. The preparation method of phosphotungstic acid according to claim 1, wherein in Scheme A, the volumetric molar concentration of the inorganic acid is 1 to 4 mol/L.

5. The preparation method of phosphotungstic acid according to claim 4, wherein in Scheme A, the mixed solution contains 10 to 150 g/L of tungsten trioxide and 5 to 100 g/L of phosphorus.

6. The preparation method of phosphotungstic acid according to claim 1, wherein in Scheme B, the mixed solution contains 10 to 150 g/L of tungsten trioxide and 10 to 100 g/L of phosphorus; and the volumetric molar concentration of the inorganic acid is 1 to 4 mol/L.

7. The preparation method of phosphotungstic acid according to claim 1, wherein in Scheme C, in the mixed solution, the volumetric molar concentration of the inorganic acid is 1 to 4 mol/L.

8. The preparation method of phosphotungstic acid according to claim 1, wherein the organic-alcohol-containing oil phase contains the organic alcohol and a diluent sulfonated kerosene.

9. The preparation method of phosphotungstic acid according to claim 8, wherein the organic alcohol is a C7-C20 alcohol.

10. The preparation method of phosphotungstic acid according to claim 9, wherein the organic alcohol is octanol to dodecanol.

11. The preparation method of phosphotungstic acid according to claim 9, wherein in the organic-alcohol-containing oil phase, the concentration of the organic alcohol is 10 to 50%.

12. The preparation method of phosphotungstic acid according to claim 11, wherein in the organic-alcohol-containing oil phase, the volumetric concentration of the organic alcohol is 10 to 30%.

13. The preparation method of phosphotungstic acid according to claim 1, wherein in Scheme C, if the industrial phosphotungstic acid crystal raw material contains molybdenum, hydrogen peroxide is firstly added in an amount of 2 to 2.5 times the total molar amount of tungsten and molybdenum into the stripping solution obtained in step III, and the molybdenum is removed by extraction with tributyl phosphate.

14. The preparation method of phosphotungstic acid according to claim 1, further comprising Scheme E: ammonia water is added or ammonia gas is introduced into the stripping solution in Scheme D, and the free ammonia in the solution is controlled at 1 to 2 mol/L to obtain an ammonium tungstate solution; and phosphorus is removed from the ammonium tungstate solution, and evaporation crystallization is carried out to obtain ammonium paratungstate.

15. The preparation method of phosphotungstic acid according to claim 3, wherein in Scheme A, the volumetric molar concentration of the inorganic acid is 1 to 4 mol/L.

16. The preparation method of phosphotungstic acid according to claim 8, further comprising Scheme E: ammonia water is added or ammonia gas is introduced into the stripping solution in Scheme D, and the free ammonia in the solution is controlled at 1 to 2 mol/L to obtain an ammonium tungstate solution; and phosphorus is removed from the ammonium tungstate solution, and evaporation crystallization is carried out to obtain ammonium paratungstate.

17. The preparation method of phosphotungstic acid according to claim 9, further comprising Scheme E: ammonia water is added or ammonia gas is introduced into the stripping solution in Scheme D, and the free ammonia in the solution is controlled at 1 to 2 mol/L to obtain an ammonium tungstate solution; and phosphorus is removed from the ammonium tungstate solution, and evaporation crystallization is carried out to obtain ammonium paratungstate.

18. The preparation method of phosphotungstic acid according to claim 10, further comprising Scheme E: ammonia water is added or ammonia gas is introduced into the stripping solution in Scheme D, and the free ammonia in the solution is controlled at 1 to 2 mol/L to obtain an ammonium tungstate solution; and phosphorus is removed from the ammonium tungstate solution, and evaporation crystallization is carried out to obtain ammonium paratungstate.

19. The preparation method of phosphotungstic acid according to claim 11, further comprising Scheme E: ammonia water is added or ammonia gas is introduced into the stripping solution in Scheme D, and the free ammonia in the solution is controlled at 1 to 2 mol/L to obtain an ammonium tungstate solution; and phosphorus is removed from the ammonium tungstate solution, and evaporation crystallization is carried out to obtain ammonium paratungstate.

20. The preparation method of phosphotungstic acid according to claim 12, further comprising Scheme E: ammonia water is added or ammonia gas is introduced into the stripping solution in Scheme D, and the free ammonia in the solution is controlled at 1 to 2 mol/L to obtain an ammonium tungstate solution; and phosphorus is removed from the ammonium tungstate solution, and evaporation crystallization is carried out to obtain ammonium paratungstate.

* * * * *